United States Patent [19]
Contiero et al.

[11] Patent Number: 5,777,366
[45] Date of Patent: Jul. 7, 1998

[54] INTEGRATED DEVICE WITH A STRUCTURE FOR PROTECTION AGAINST HIGH ELECTRIC FIELDS

[75] Inventors: Claudio Contiero, Buccinasco; Riccardo Depetro, Domodossola, both of Italy

[73] Assignee: SGS-Thomson Microelectronics S.r.l., Agrate Brianza, Italy

[21] Appl. No.: 553,154

[22] Filed: Nov. 7, 1995

[30] Foreign Application Priority Data

Nov. 8, 1994 [EP] European Pat. Off. ............ 94830530

[51] Int. Cl.$^6$ .............................................. H01L 23/62
[52] U.S. Cl. ................... 257/355; 257/356; 257/492; 257/493
[58] Field of Search ............................... 257/355, 356, 257/488, 491, 492, 493

[56] References Cited

U.S. PATENT DOCUMENTS

| | | | |
|---|---|---|---|
| 5,040,045 | 8/1991 | McArthur et al. | 257/491 |
| 5,434,445 | 7/1995 | Ravanelli et al. | 257/488 |

FOREIGN PATENT DOCUMENTS

| | | | |
|---|---|---|---|
| A-0 011 879 | 6/1980 | European Pat. Off. | H01L 29/78 |
| A-2 077 493 | 12/1981 | Japan | H01L 29/78 |

*Primary Examiner*—Minh-Loan Tran
*Attorney, Agent, or Firm*—Wolf, Greenfield & Sacks P.C.; James H. Morris

[57] ABSTRACT

An integrated device including a structure for protection against electric fields. The protection structure may include a first region of conducting material electrically connected to the gate/source region of the device at a first potential. The protection structure may also include a second region of conducting material electrically connected to the drain region of the device at a second potential differing from the first. In one embodiment, the first region of conducting material is comb-shaped, and includes a first number of fingers separated by a plurality of gaps. The second region of conducting material includes portions extending at the aforementioned gaps to form a comb structure. Thus, the body of semiconductor material of the device sees a protection region formed by a pair of interlocking comb structures at an intermediate potential between the first and second potentials.

38 Claims, 4 Drawing Sheets

INTEGRATED DEVICE WITH A STRUCTURE FOR PROTECTION AGAINST HIGH ELECTRIC FIELDS

BACKGROUND OF THE INVENTION

1. Field of the Invention

The present invention relates to an integrated device with a structure for protection against high electric fields, "high electric fields" being intended to mean electric fields close to the critical field resulting in breakdown of the device.

2. Discussion of the Related Art

Those skilled in the art are familiar with what are known as "field plate" structures which are formed over a semiconductor body for protecting the integrated components in the semiconductor body from external electric fields or those electric fields generated by the voltages applied to the components. Such structures are typically employed for high-voltage devices (ranging from a few tens to a few hundred volts) for ensuring correct operation of the device.

The problem involved is illustrated by, for example, the case of an N-channel DMOS lateral transistor operating in RESURF (REduced SURface Field) conditions and comprising: normally bypassed source and body regions; a gate electrode; and a drain region, formed by a lightly doped $N^-$ region known as a drift region and by an $N^+$ type contact region. Such a transistor is shown in FIG. 1, and comprises a wafer 1 including a $P^-$ type substrate 2 and an $N^-$ type epitaxial layer 3, forming a drift region 4. Epitaxial layer 3 houses a P type body region 5 which, in turn, houses a source region 6. Source region 6 is electrically connected to body region 5 by a contact 7 via a $P^+$ doped region 8. A polysilicon gate region 10 extends over surface 11 of wafer 1 and is insulated electrically from underlying body region 5 and epitaxial layer 3 by a thin oxide layer 13 and by part of a thick field oxide layer 14. Oxide layer 14 extends over drift region 4 and is interrupted at an $N^+$ type drain region 15. Over surface 11 of wafer 1 and gate region 10, there extends a PSG (Phosphorous Silicon Glass) isolating layer 16 interrupted at source contact 7 and gate and drain contacts 20 and 21. The device is covered by a passivation layer 22.

For the transistor shown in FIG. 1 to withstand a high inverse voltage $V_{DSS}$ (drain-source voltage with the source and gate bypassed), in addition to appropriately doping the various regions of wafer 1 and correctly sizing the oxide layers (gate oxide, PSG oxide), the extension of the metal gate and drain regions 20 and 21 must also be sized correctly to prevent the formation of peak electric fields close to the surface (crowding of the equipotential lines shown by the thin lines in FIG. 1) which would result in premature breakdown of the device.

Moreover, for the structure to be reliable, (i.e. to prevent its maximum breakdown voltage from varying with time) conduction or charge movement phenomena must be prevented in dielectric layers 14, 16, 22 over drift region 4, which would alter the electric field value of wafer 1. In other words, the reliability of the structure depends on the potential distribution between the source/drain and gate electrodes remaining unchanged with time.

One conventional way of distributing voltage between the drain and source/gate electrodes, or more generally speaking between a high- and low-voltage electrode, is to use resistive materials such as SIPOS (Semi-Insulated POlycrystalline Silicon) as described, for example, in the article entitled "A 500V 1A 1-Chip Inverter IC with a New Electric Field Reduction Structure", by K. Endo, Y. Baba, Y. Udo, M. Yasui and Y. Sano, Proc. of the 6th Internat. Symposium on Power Semiconductor Device & IC's, Davos Switzerland, 31 May–2 Jun., 1994, IEEE Cat. n. 94CH3377-9. Such a solution, however, fails to ensure the reliability of the structure, since the electric characteristics of the material varying with temperature and the voltage applied.

Other known solutions employ variously designed floating field plates. Their performance, however, is less than satisfactory since floating electrodes, not referenced to fixed potentials, are themselves unstable.

The above problems relative to a DMOS lateral transistor also apply to any other type of high-voltage structure, including a straightforward diode comprising $P^+$ and $N^+$ regions embedded in an $N^-$ layer.

SUMMARY OF THE INVENTION

It is an object of the present invention to provide a reliable structure which protects against the electric fields in high-voltage integrated devices.

It is another object of the present invention to provide such a structure which ensures high breakdown voltages and protection which is both stable with time and unaffected by temperature.

In one aspect, the present invention, provides an integrated device featuring a structure for protection against electric fields. The integrated device includes a body of semiconductor material, a first device region, a second device region, a first region of conducting material and a second region of conducting material. The first device region is located above a first portion of the body of semiconductor material, and the second device region is located above a second portion of semiconductor material. The first region of conducting material is electrically connected to the first device region, and the second region of conducting material is electrically connected to the second device region. Each region of conducting material includes fingers having gaps therebetween. The first region of conducting material and the second region of conducting material are arranged so that each finger of the second region of conducting material is disposed within a gap between adjacent fingers of the first region of conducting material.

In another aspect, the present invention provides a field plate interdigitated between the positive and negative electrode. The field plate distributes equipotential lines in the wafer of semiconductor material in which the device components such as the above DMOS transistor are integrated in such a manner as to prevent the formation of high electric fields in the wafer. In particular, the field plate protects the drift region from the effects of charge movements in the upper dielectric layers.

BRIEF DESCRIPTION OF THE DRAWINGS

A number of preferred, non-limiting embodiments of the present invention will be described in the detailed description by way of example with reference to the accompanying drawings, in which.

DETAILED DESCRIPTION

Figure 1:
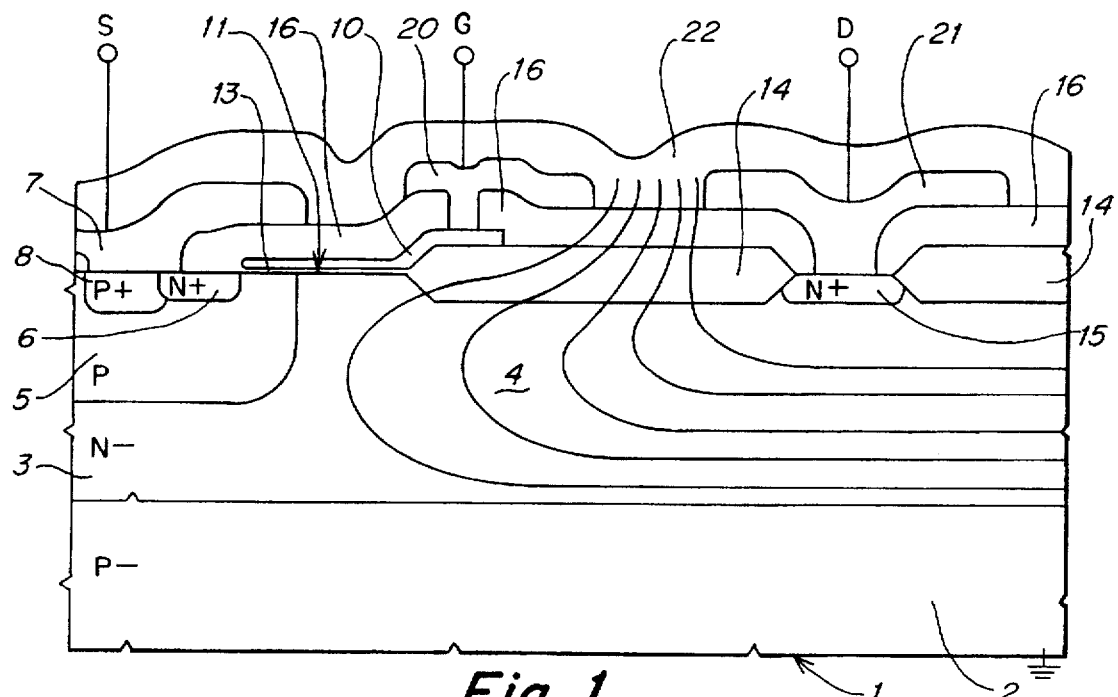
FIG. 1 shows a cross section of a known DMOS transistor.
Figure 2:
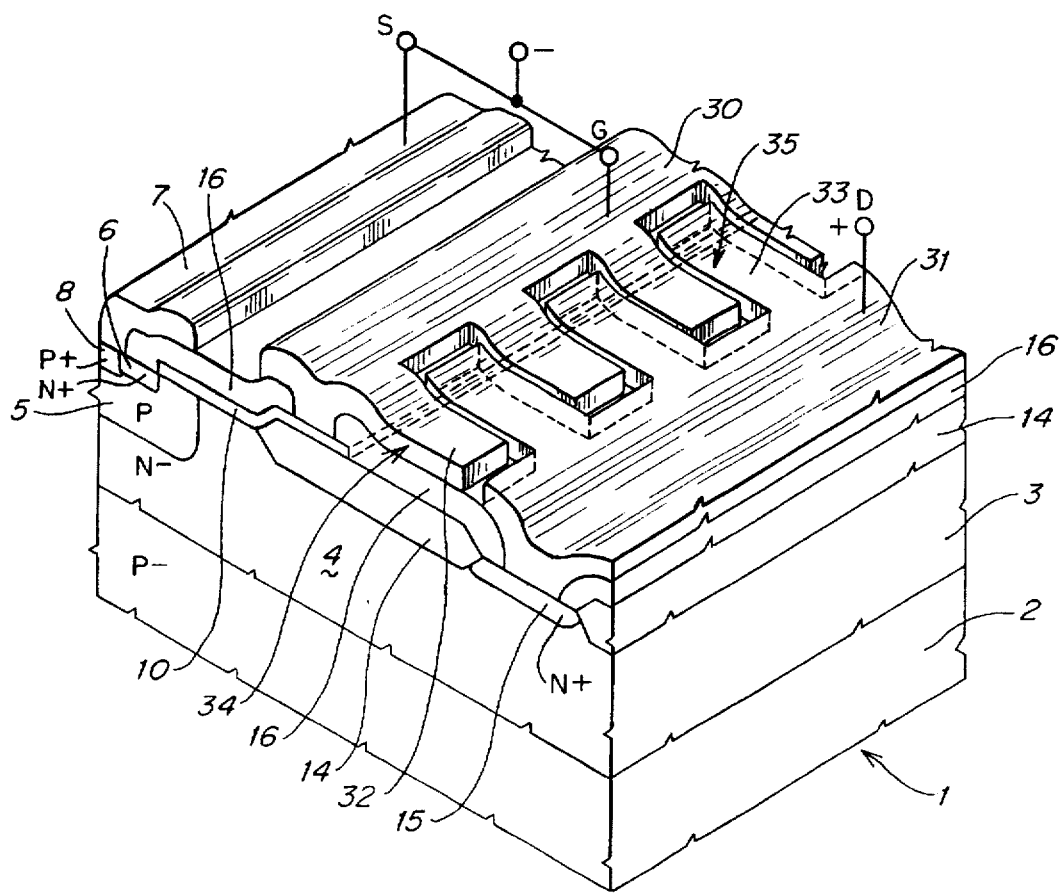
FIG. 2 shows a perspective view of a DMOS transistor according to a first embodiment of the present invention.

In FIG. 2, the parts in common with FIG. 1 (the DMOS transistor regions formed in and on wafer 1 of semiconductor material) are indicated using the same numbering system with no further description. For the sake of clarity, thin gate oxide layer 13 and passivation layer 22 are not shown in FIGS. 2 and 10–12.

In FIG. 2, a protection structure is formed over wafer 1 by gate and drain contacts 30 and 31, which include comb portions 34 and 35 having respective teeth 32 and 33, respectively. The comb portions are interlocked or interdigitated so that each "finger" 32, 33 of one comb portion 34, 35 is inserted, in a noncontacting manner, between two adjacent fingers 33, 32 of the other comb portion 35, 34 (see also FIG. 3). In the embodiment shown in FIG. 2, fingers 32, 33 are all the same shape (rectangular) and the same size and the passivation layer (not shown) is inserted in the gap between fingers 32 and 33.

The protection structure according to the invention operates on the following principle. In the transistor of FIG. 1, in the absence of a protection structure and with the gate and drain contact regions 20 and 21 facing each other along substantially parallel edges, the equipotential surfaces are distributed evenly between the two contacts in passivation layer 22 and wafer 1. In contrast, with the comb structure depicted in FIG. 2, drift region 4 is entirely covered, except for the thin zig-zag region electrically separating the gate and drain electrodes 30 and 31. Therefore, each point is strongly affected by the combined action of the electric field generated by both electrodes. In particular, by providing small fingers 32, 33 with respect to the thickness of oxide layers 14 and 16 (see FIG. 3) and a small gap "d" between the fingers (width "1" of the fingers and gap "d" of the same order as the thickness of the oxide), the electric field "seen" inside wafer 1 at drift region 4 of length $L_D$ is equivalent to that which would be generated by a single electrode covering the whole of the drift region and at an intermediate potential with respect to those of electrodes 30, 31. In other words, the interdigitated gate and drain contact structures act to reduce the potential between the drain and the gate, in the drift region and passivation layers, to an intermediate potential so as to overcome the problem discussed above.

Figure 3:
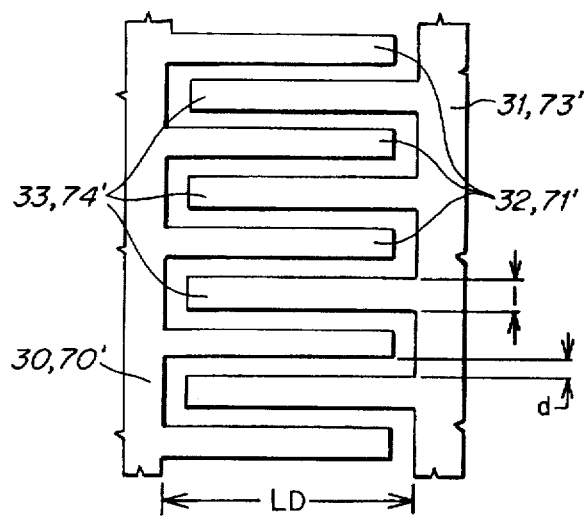
FIG. 3 shows a top plan view of the layout of the structure of FIG. 2.

In the embodiment shown in FIGS. 2 and 3, wherein fingers 32, 33 are in the form of rectangles of the same width and length, each point of drift region 4 "sees" electrodes 30 and 31 (i.e. fingers 32 and 33) at substantially the same distance and of the same area, thus achieving a field distribution equivalent to that generated by one electrode at a constant voltage equal to the mean potential of electrodes 30, 31.

Figure 4:
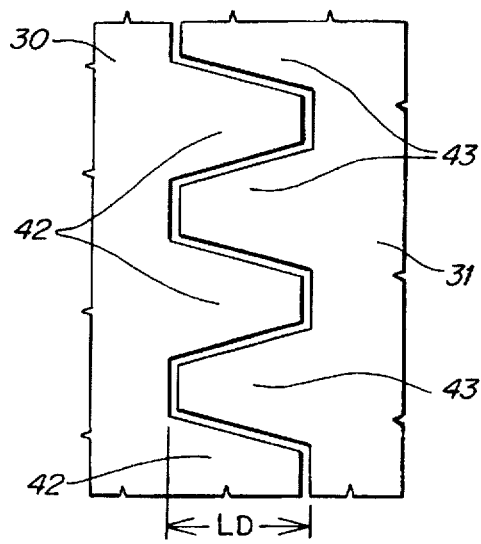
FIG. 4 shows a variation of the protection structure of FIG. 3.

It is to be appreciated that the voltage in the drift region can be modified by altering the shape of the comb region fingers. In the embodiment shown in FIG. 4, the fingers 42, 43 are again all the same shape, but in the form of a trapezium. A result of the drain and gate electrodes of this size and shape is drift region 4 presents an electric field equivalent to that generated by a variable voltage source increasing linearly from left to right (as shown in FIG. 4) as a function of an area ratio of fingers 42 and 43 at each surface section.

Figure 5:
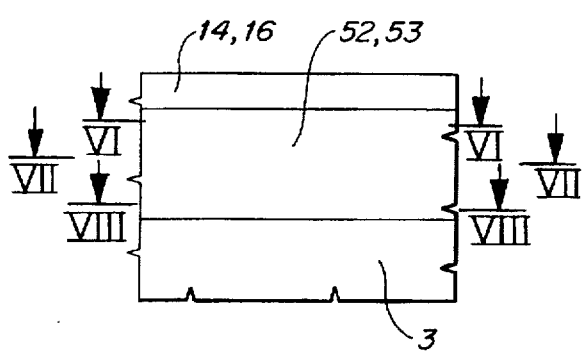
FIG. 5 shows a cross-sectional view of a FIG. 4.
Figure 6:
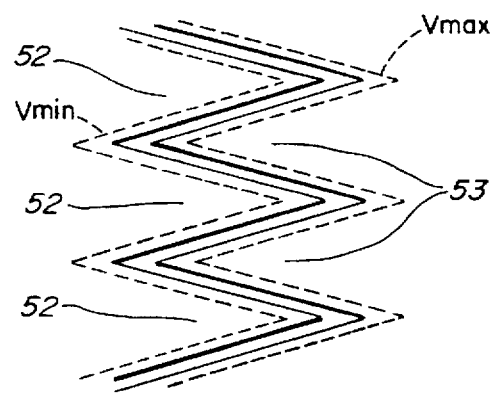
FIGS. 6–8 show the electric field of the protection structure of FIG. 4 at different sections of a silicon wafer and at different depths as shown in FIG. 5.
Figure 7:
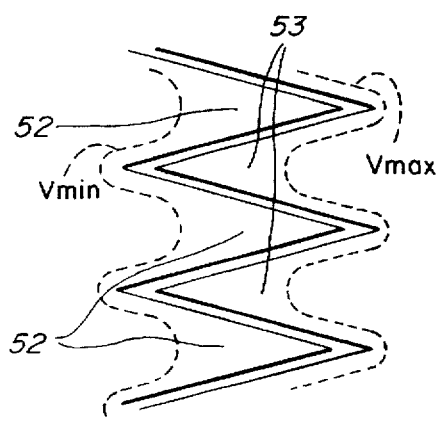
Figure 8:
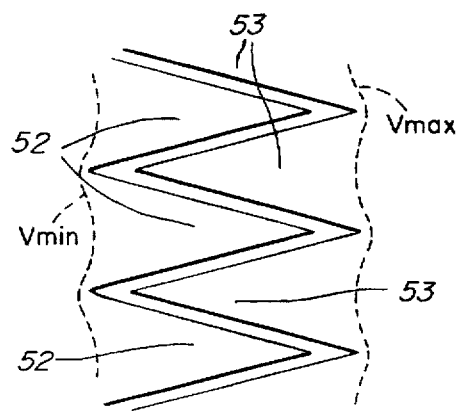

In the embodiment depicted in FIG. 5 the fingers 52, 53 are triangular. FIGS. 6–8 show the minimum and maximum equipotential lines $V_{max}$, $V_{min}$ of the device at different depths of the dielectric layer formed jointly by field oxide layer 14 and PSG oxide layer 16 (as represented by depth VI). As can be seen, in the composite layer 14, 16, close to fingers 52, 53 of the electrodes (FIG. 6), the maximum and minimum voltage lines (equal to the potential of the electrodes) present a pattern practically identical to the edge of the electrodes. At an intermediate depth (represented by VII as shown in FIG. 7), the indirect effect of the two electrodes is illustrated, wherein the maximum and minimum voltage line pattern is more gradual. Close to wafer 1 (at depth VIII as shown in FIG. 8), the maximum and minimum potential line patterns are fairly straight with only small undulations. In the region between the maximum and minimum potential lines, potential distribution is linear.

By appropriately selecting the width, shape and distance between the electrodes and the distance between the electrodes and wafer 1, the set potential may be made to follow on average the best potential distribution for the device in each case, thus eliminating the risk of premature breakdowns in wafer 1 (at junctions or induced by peaks) and so improving the stability of the electric parameters during the working life of the device.

Figure 9:
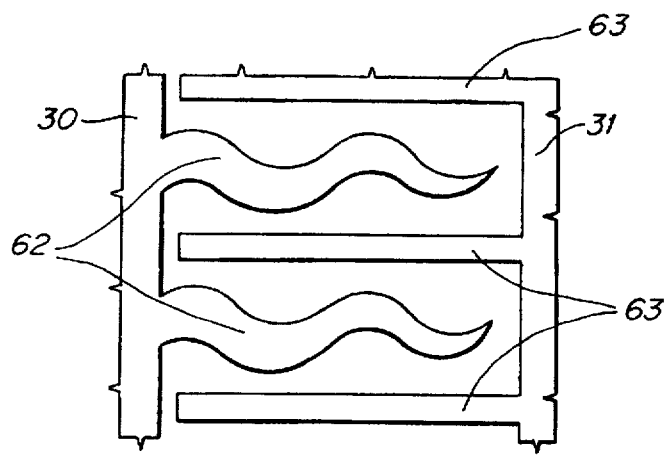
FIG. 9 shows a top plan view of a further embodiment of a protection structure according to the present invention.

FIG. 9 shows a further variation of the comb portion fingers of electrodes 30 and 31. Curved fingers 62 are formed by electrode 30, and rectangular fingers 63 are formed by electrode 31.

According to a further embodiment of the invention, the electrodes may be formed by different layers deposited on the surface of wafer 1 and more specifically by appropriately shaping the polysilicon layer forming the gate region and/or the metal layer forming the contacts and connecting lines.

Figure 10:
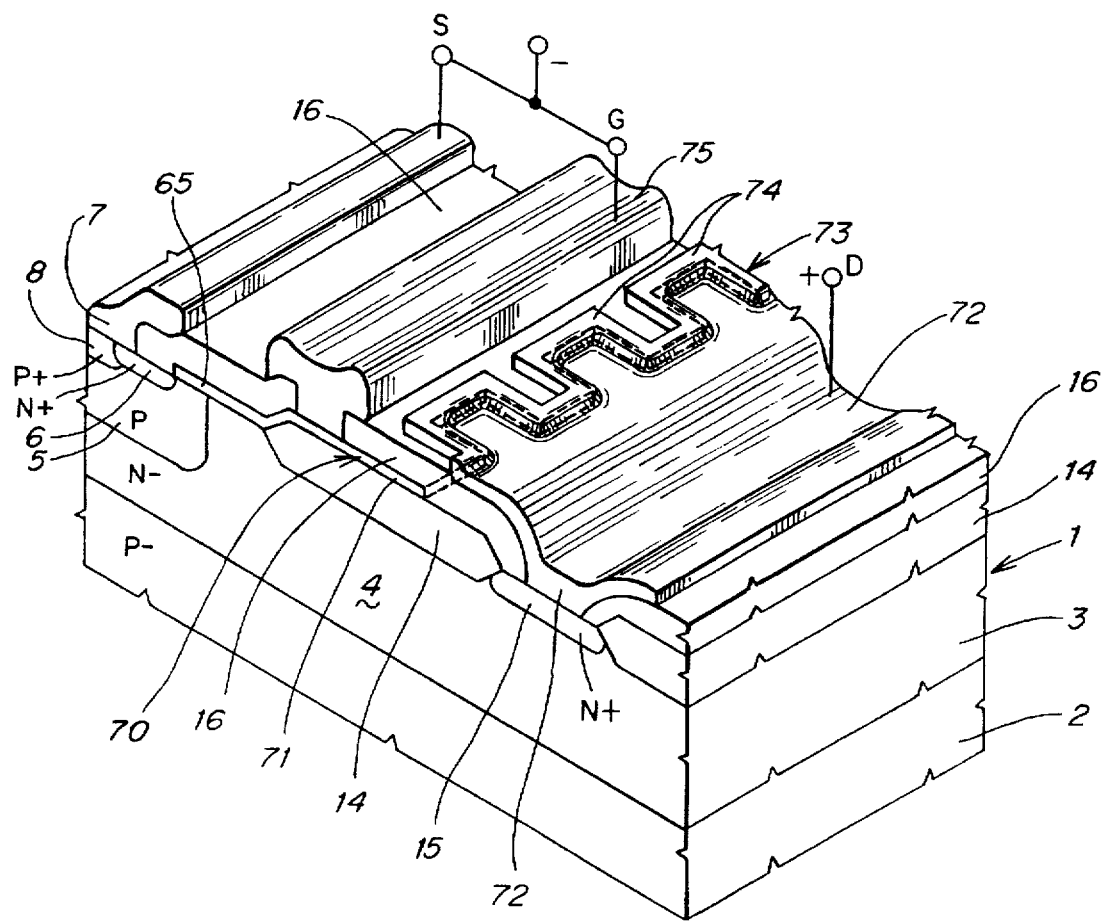
FIG. 10 shows a perspective view of yet a further embodiment of a protection structure according to the present invention.
Figure 11:
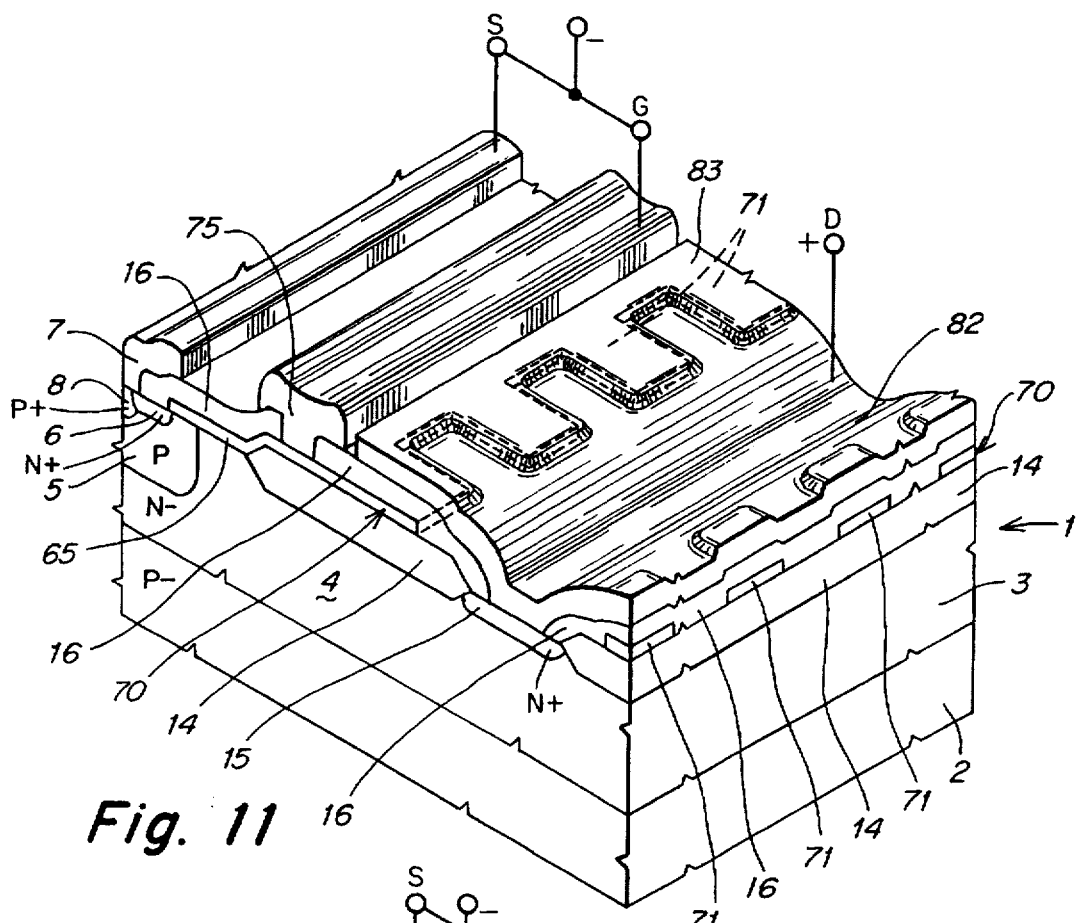
FIG. 11 shows a perspective view of another embodiment of a protection structure according to the present invention.

In the embodiments shown in FIGS. 10 and 11, the comb structures are formed in different layers. More specifically, in FIG. 10, the gate region 65 includes a comb region 70 with fingers 71. The drain electrode 72 also includes a comb region 73 with fingers 74. Comb region 73 is located over but electrically separated from comb region 70 by PSG oxide region 16, and fingers 71 and 74 are mutually offset and sized to overlap slightly at the edges. Alternatively, fingers 71, 74 may be sized to not overlap, as in FIG. 3, (i.e., so that the width of each finger 71', 74' is less than the distance between two fingers of the other comb region 70', 73'). In both cases, the gate electrode 75 is formed as in FIG. 1, with no comb regions.

In the embodiment depicted in FIG. 11, metal region 82 operates as the drain electrode, and contacting drain region 15 comprises an unshaped portion 83 extending over drift region 4. Therefore, portion 83 covers the whole of comb region 70 of gate region 65 but is isolated from it by dielectric layer 16. In this embodiment, fingers 71 of comb region 70 shield part of unshaped portion 83 so that only the unshielded parts of unshaped portion 83 are seen by drift region 4. Flat portion 83 therefore functions as though it, too, were comb-shaped, with fingers located precisely between fingers 71 of comb region 70 and of exactly the same size as the gap between fingers 71. The structure shown in FIG. 11 is functionally the same as that of FIG. 10 but geometrically simpler.

Figure 12:
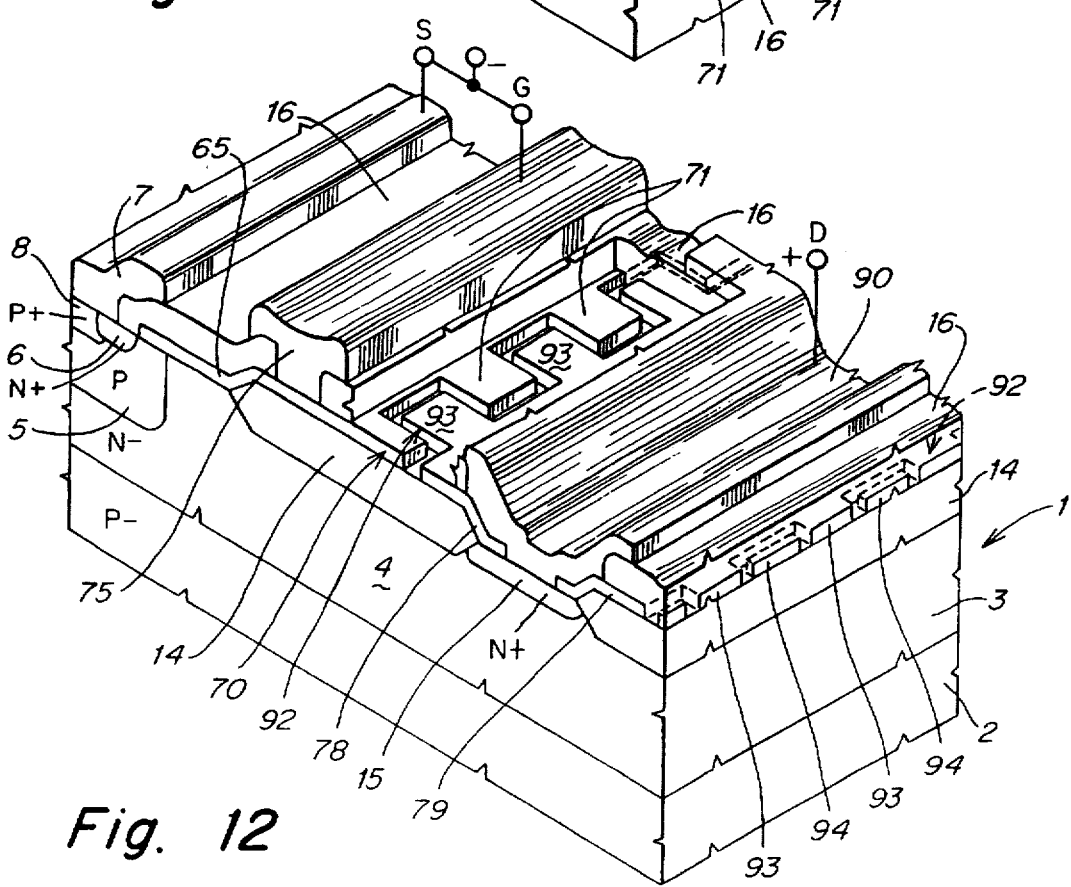
FIG. 12 shows a perspective view of yet another embodiment of a protection structure according to the present invention.

In the embodiment shown in FIG. 12, both comb regions are formed using the polysilicon layer forming gate region 65. More specifically, gate region 65 again includes comb region 70 with fingers 71. The drain electrode is formed in a number of parts including a first polysilicon region 78, a second polysilicon region 79, and a metal region 90. The first and second polysilicon regions 78, 79 extend symmetrically with respect to drain region 15, and both present a portion contacting drain region 15 and a portion superimposed on field oxide layer 14. The portions of regions 78, 79 contacting drain region 15 are separated to permit metal region 90 to directly contact drain region 15 and the portion of each polysilicon region 78, 79 superimposed on the field oxide layer includes a comb region 92 with fingers 93. More specifically, comb region 92 of first polysilicon region 78 interlocks with comb region 70 of gate region 65 and comb region 92 of the second polysilicon region 79 interlocks with another comb region 94 forming part of the integrated device in wafer 1, (e.g. a further gate region).

All the above embodiments operate as described with reference to FIG. 2, so that the electric field in the underlying drift layer 4 is uniform, does not vary with time, and brings about no permanent temperature-induced change in the electric characteristics of the device.

Some advantages of the protective structure according to the present invention are as follows. Firstly, it ensures optimum, stable voltage distribution as discussed above. By appropriately selecting the shape of the comb regions, it is possible to determine the potential seen by wafer 1. In particular, the potential is referenced to constant predetermined voltages (source/gate and drain potentials). In addition, the structure covers almost the whole of the drift region in the epitaxial layer, thus protecting the region most subject to breakdown. Secondly, the electrical characteristics of the structure are stable, independent of the voltage applied, and result in no permanent temperature-induced alteration of the device by virtue of the structure comprising no resistive or capacitive dividers. Finally, any charge movements in the layers overlying the structure are fully shielded.

It is to be appreciated that changes may be made to the structure as described and illustrated herein without, however, departing from the scope of the present invention. In particular, and as already stated, the interlocking comb structures may be formed from the same layer of material shaped in the same step (polysilicon layer, metal layer), or from different layers of different materials deposited in different steps.

In particular, changes may be made to the shape of the fingers of the comb regions, depending on the potential distribution required. The fingers may be rectangular, triangular, polygonal (regular or irregular), in the form of a concave or convex arc, or of composite shape. Spacing of the fingers may be constant or variable, depending on the potential distribution required. The fingers of the comb structures (one high- and the other low-voltage) may be of the same or different shapes and sizes. The comb regions may be actually formed as such, or, may be shaped differently, providing they function as comb-shaped regions.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated device, comprising:

a semiconductor material having a surface, the semiconductor material including a first portion and a second portion;

a first device region disposed in the first portion of the semiconductor material, the first device region being at a first potential;

a second device region disposed in the second portion of the semiconductor material, the second device region being at a second potential, the second potential being different than the first potential, the second device region being parallel to the first device region; and first and second potential distribution regions extending over the surface of the semiconductor material, the first potential distribution region including a first region of conducting material electrically connected to the first device region, the first region of conducting material having a first plurality of fingers disposed perpendicular to the first device region, wherein a gap is disposed between adjacent fingers of the first plurality of fingers, and the second potential distribution region includes a second region of conducting material including a second plurality of fingers disposed perpendicular to the second device region, each finger of the second plurality of fingers being located within the gap between adjacent fingers of the first plurality of fingers, the first and second potential distribution regions forming a pair of interdigitated comb structures and at an intermediate potential between the first potential and the second potential.

2. The integrated device of claim 1, wherein the first region of conducting material and the second region of conducting material are formed from a same layer of material, and wherein the second plurality of fingers are electrically insulated from the first plurality of fingers.

3. The integrated device of claim 2, further comprising a metal layer forming electrodes electrically coupled to the first device region and the second device region, and wherein the first region of conducting material and the second region of conducting material are formed in the metal layer which forms the electrodes.

4. The integrated device of claim 2, further comprising a metal layer forming electrodes, electrically coupled to the first device region and the second device region, and a layer of polycrystalline silicon, wherein the first region of conducting material and the second region of conducting material are formed in the polycrystalline silicon layer which is electrically connected to the electrodes.

5. The integrated device of claim 2, wherein the first plurality of fingers have a first shape and the second plurality of fingers have a second shape, the first shape being the same as the second shape.

6. The integrated device of claim 2, wherein the first plurality of fingers have a first shape and the second plurality of fingers have a second shape, the first shape being different than the second shape.

7. The integrated device of claim 2, wherein the first plurality of fingers are rectangular.

8. The integrated device of claim 2, wherein the first plurality of fingers are triangular.

9. The integrated device of claim 2, wherein the first plurality of fingers are curved.

10. The integrated device of claim 1, wherein the first region of conducting material comprises a first layer of material and the second region of conducting material comprises a second layer of material, the first layer of material being different than the second layer of material, and wherein the first layer of material and the second layer of material are superimposed.

11. The integrated device of claim 10, further comprising a layer of dielectric material disposed between the first layer of material and the second layer of material, wherein the first layer of material comprises a polycrystalline silicon layer and the second layer of material comprises a metal layer, the layer of dielectric material electrically insulating the second region of conducting material from the first region of conducting material.

12. The integrated device of claim 11, wherein the second plurality of fingers are located above the gaps between adjacent fingers of the first plurality of fingers.

13. The integrated device of claim 12, wherein the second plurality of fingers are larger than the gaps between the adjacent fingers of the first plurality of fingers, and wherein each finger of the second plurality of fingers is located above and partially superimposed over the adjacent first plurality of fingers.

14. The integrated device of claim 12, wherein the second plurality of fingers are smaller than the gaps between the first plurality of fingers.

15. The integrated device of claim 11, wherein the second region of conducting material comprises a plate region, the plate region being located above the polycrystalline silicon layer.

16. The integrated device of claim 1, wherein the first potential is less than the second potential.

17. The integrated device of claim 1, comprising a lateral DMOS transistor having a gate region, a source region at the first potential and a drain region at the second potential, wherein the first potential is less than the second potential, the second device region comprising the drain region and the first device region comprising the gate region, the source region being electrically connected to the gate region.

18. The integrated device of claim 17, wherein the gate region of the DMOS transistor includes an extension, the first region of conducting material comprising the extension of the gate region.

19. The integrated device of claim 17, comprising a lateral DMOS transistor having a gate region, a source region at the first potential and a drain region at the second potential, wherein the first potential is less than the second potential, the second device region comprising the drain region and the first device region comprising the gate region.

20. An integrated device, comprising:
a semiconductor material having a surface, the semiconductor material including a first portion and a second portion;
a first device region disposed in the first portion of the semiconductor material;
a second device region disposed in the second portion of the semiconductor material, the second device region being parallel to the first device region;
a first region of conducting material disposed above the first device region and electrically coupled to the first device region, the first region of conducting material having a first plurality of fingers disposed perpendicular to the second device region, wherein a gap is disposed between adjacent fingers of the first plurality of fingers; and
a second region of conducting material disposed above the first device region and electrically coupled to the second device region, the second region of conducting material including a second plurality of fingers, each finger of the second plurality of fingers being located within the gap between the adjacent fingers of the first plurality of fingers to form a structure for protection against high electric fields between the first device region and the second device region.

21. The integrated device of claim 20, wherein the first region of conducting material and the second region of conducting material are formed in a same layer of material.

22. The integrated device of claim 20, wherein the second plurality of fingers are electrically insulated from the first plurality of fingers.

23. The integrated device of claim 20, wherein the first region of conducting material comprises a first material and the second region of conducting material comprises a second material, the second material being different than the first material.

24. The integrated device of claim 20, further comprising a layer of dielectric material, the layer of dielectric material being disposed between the first region of conducting material and the second region of conducting material so that the second region of conducting material is electrically insulated from the first region of conducting material.

25. The integrated device of claim 20, further comprising an oxide layer having a thickness and being disposed between the semiconductor material and the first device region, wherein a gap is disposed between each finger of the first plurality of fingers and each finger of the second plurality of fingers, the gap having a width which is less than the thickness of the oxide layer.

26. The integrated device of claim 20, wherein the first device region is at a first potential and the second device region is at a second potential, the second potential being different from the first potential.

27. The integrated device of claim 20, further comprising a metal layer forming electrodes electrically coupled to the first device region and the second device region, and wherein the first region of conducting material and the second region of conducting material are formed in the metal layer which forms the electrodes.

28. The integrated device of claim 20, further comprising a metal layer forming electrodes electrically coupled to the first device region and the second device region and a polycrystalline silicon layer, wherein the first region of conducting material and the second region of conducting material are formed in the polycrystalline silicon layer which is electrically connected to the electrodes.

29. The integrated device of claim 20, wherein the first region of conducting material comprises a polysilicon layer and the second region of conducting material comprises a contact metal layer.

30. An integrated device, comprising:
a semiconductor material having a surface, the semiconductor material including a first portion and a second portion;
a first device region disposed in the first portion of the semiconductor material;
a second device region disposed in the second portion of the semiconductor material, the second device region being parallel to the first device region;
a first region of conducting material electrically coupled to the first device region, the first region of conducting material having a first plurality of fingers disposed perpendicular to the first device region, wherein a gap is disposed between adjacent fingers of the first plurality of fingers; and a second region of conducting material electrically coupled to the second device region, the second device region of conducting material having a second plurality of fingers disposed perpendicular to the second device region and interdigitated with the first plurality of fingers, the second device region of conducting material being at least partially disposed above the first region of conducting material.

31. The integrated device of claim 30, wherein the second region of conducting material includes a second plurality of fingers, a width of each finger of the second plurality of fingers being smaller than the gaps between adjacent fingers of the first plurality of fingers.

32. The integrated device of claim 30, wherein each finger of the second plurality of fingers is superimposed over the gaps between adjacent fingers of the first plurality of fingers.

33. The integrated device of claim 32, wherein each finger of the second plurality of fingers partially overlaps adjacent fingers of the first plurality of fingers.

34. The integrated device of claim 30, wherein the second region of conducting material includes a first portion comprising a first material and a second portion comprising a second material, the first material being different from the second material.

35. The integrated device of claim 30, wherein the first device region is at a first potential and the second device region is at a second potential, the second potential being different from the first potential.

36. The integrated device of claim 30, wherein all of the second device region of conducting material is disposed above the first region of conducting material.

37. An integrated device, comprising:

a semiconductor material having a surface, the semiconductor material including a first portion and a second portion;

a first device region disposed in the first portion of the semiconductor material;

a second device region disposed in the second portion of the semiconductor material, the second device region being parallel to the first device region; and means, disposed perpendicular to the first and second device regions, above the first and second device regions and between the first device region and the second device region, for preventing breakdown of the integrated device due to high electric fields between the first device region and the second device region.

38. The integrated device of claim 37, wherein the first device region is at a first potential and the second device region is at a second potential, the second potential is different than the first potential, and wherein the means for preventing breakdown of the integrated device includes means for maintaining an electric potential within the semiconductor material constant with time.

* * * * *